United States Patent
Kinugawa et al.

(10) Patent No.: US 10,640,294 B2
(45) Date of Patent: May 5, 2020

(54) ARTICLE TRANSPORT BODY

(71) Applicant: Daifuku Co., Ltd., Osaka-shi (JP)

(72) Inventors: Tomotaka Kinugawa, Hinocho (JP); Hiroshi Sakata, Hinocho (JP); Hiroshi Otsuka, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 16/427,521

(22) Filed: May 31, 2019

(65) Prior Publication Data

US 2019/0382206 A1    Dec. 19, 2019

(30) Foreign Application Priority Data

Jun. 19, 2018 (JP) ................. 2018-116405

(51) Int. Cl.
| | |
|---|---|
| *B65G 19/02* | (2006.01) |
| *B65G 19/00* | (2006.01) |
| *H01L 21/677* | (2006.01) |
| *H01L 21/67* | (2006.01) |
| *B65G 19/22* | (2006.01) |
| *B65G 47/26* | (2006.01) |
| *B65G 47/51* | (2006.01) |

(52) U.S. Cl.
CPC .......... *B65G 19/225* (2013.01); *B65G 19/02* (2013.01); *B65G 47/268* (2013.01); *B65G 47/5104* (2013.01); *H01L 21/67706* (2013.01); *H01L 21/67733* (2013.01); *B65G 2201/02* (2013.01)

(58) Field of Classification Search
None
See application file for complete search history.

(56) References Cited

U.S. PATENT DOCUMENTS

| | | | | |
|---|---|---|---|---|
| 4,144,965 A | * | 3/1979 | Alldredge | B65G 21/22 198/838 |
| 9,312,158 B2 | * | 4/2016 | Wada | B66C 13/06 |
| 9,576,832 B2 | | 2/2017 | Tomida | |

FOREIGN PATENT DOCUMENTS

JP         201694263 A    5/2016

* cited by examiner

*Primary Examiner* — Kavel Singh
(74) *Attorney, Agent, or Firm* — The Webb Law Firm (57) ABSTRACT

A support portion includes: a first portion that is supported on a travel portion; a second portion that is coupled to a holding portion; and a damper portion that is provided between the first portion and the second portion. The damper portion includes: a guide portion that guides movement of the first portion relative to the second portion along a specific guiding direction; a link mechanism that is coupled to each of the first portion and the second portion, and that moves in conjunction with movement of the first portion relative to the second portion; and an elastic body. The elastic body is coupled to the link mechanism so as to dampen operation of the link mechanism.

5 Claims, 7 Drawing Sheets

ARTICLE TRANSPORT BODY

CROSS-REFERENCE TO RELATED APPLICATION

This application claims priority to Japanese Patent Application No. 2018-116405 filed Jun. 19, 2018, the disclosure of which is hereby incorporated by reference in its entirety.

BACKGROUND OF THE INVENTION

1. Field of the Invention

The present invention relates to an article transport body including a travel portion, a holding portion that holds an article, and a support portion that supports the holding portion relative to the travel portion.

2. Description of the Related Art

An example of the article transport body as described above is disclosed in JP 2016-94263A (Patent Document 1). In the following, the reference numerals shown in parentheses in the Description of the Related Art are those of Patent Document 1. Patent Document 1 discloses a ceiling guided vehicle (1) including a travel/movement portion (16), a transported article support portion (32) that holds a transported article (6), and a support mechanism (23) that supports the transported article support portion (32) relative to the travel/movement portion (16). The support mechanism (23) includes an elevation body (31) that is supported on the travel/movement portion (16) via an elevation operation mechanism (24), and a guiding support portion (35) that supports the transported article support portion (32). With the ceiling guided vehicle (1), a buffer body (36) that is formed from an elastic member such as a rubber material and is elastically deformable in the up-down direction is provided between the elevation body (31) and the guiding support portion (35), and, thereby, the transmission of vibration from the travel/movement portion (16) side to the transported article (6) held on the transported article support portion (32) is suppressed.

SUMMARY OF THE INVENTION

As described above, with the configuration described in Patent Document 1, an elastic body that is deformable in a direction in which vibration is to be suppressed (hereinafter referred to as "subject direction") is sandwiched between two members (in the configuration of Patent Document 1, the elevation body and the guiding support portion) that are provided so as to be relatively displaceable in the subject direction, and, thereby, the transmission of vibration between the two members in the subject direction is suppressed, thus suppressing the transmission of vibration from the travel portion side to the article held on the holding portion. With such a configuration, in response to relative displacement between the two members in the subject direction, the elastic body deforms in the subject direction to a degree comparable to the relative displacement amount between the two members, and, thereby, the transmission of vibration between the two members in the subject direction is suppressed. Accordingly, as the elastic body, it is necessary to use a material having the desired elastic deformability (deformation amount relative to the load, etc.) in the subject direction. However, due to constraints on the placement space for the elastic body, for example, it may be difficult to use an elastic body that has the desired elastic deformability in the subject direction.

Therefore, it is desirable to realize an article transport body that can reduce the constraints on the elastic deformability required for an elastic body when the elastic body is used to suppress the transmission of vibration from the travel portion side to an article held on the holding portion.

An article transport body according to the present disclosure includes: a travel portion; a holding portion that holds an article; and a support portion that supports the holding portion relative to the travel portion; wherein the support portion includes: a first portion that is supported on the travel portion; a second portion that is coupled to the holding portion; and a damper portion that is provided between the first portion and the second portion, the damper portion includes: a guide portion that guides movement of the first portion relative to the second portion along a specific guiding direction; a link mechanism that is coupled to each of the first portion and the second portion, and that moves in conjunction with movement of the first portion relative to the second portion; and an elastic body, and the elastic body is coupled to the link mechanism so as to dampen operation of the link mechanism.

With this configuration, the damper portion provided between the first portion and the second portion includes the guide portion that guides the movement of the first portion relative to the second portion along a specific guiding direction, the link mechanism that moves in conjunction with the movement of the first portion relative to the second portion, and the elastic body, and the elastic body is coupled to the link mechanism so as to dampen the operation of the link mechanism. Accordingly, the transmission of vibration between the first portion and the second portion along the guiding direction can be suppressed by the damper portion. Since the elastic body is coupled to the link mechanism so as to dampen the operation of the link mechanism at this time, the effect of converting the displacement amount or the displacement direction by the link mechanism can make the deformation amount of the elastic body different from the amount of displacement of the first portion relative to the second portion, or make the deformation direction of the elastic body different from the displacement direction (i.e., the guiding direction) of the first portion relative to the second portion. Accordingly, unlike a case where the elastic body is sandwiched between the first portion and the second portion, the elastic deformability required for the elastic body can be adjusted using the configuration of the link mechanism, the coupling configuration of the elastic body to the link mechanism, and the like, and it is thus possible to reduce the constraints on the elastic deformability required for the elastic body. Since the first portion is supported on the travel portion, and the second portion is coupled to the holding portion that holds an article in the above-described configuration, the transmission of vibration in the guiding direction from the travel portion side to the article held on the holding portion can be suppressed using the elastic body.

Thus, with the above-described configuration, it is possible to reduce the constrains on the elastic deformability required for an elastic body when the elastic body is used to suppress the transmission of vibration from the travel portion side to an article held on the holding portion.

Further features and advantages of the article transport body will become apparent from the following description of embodiments with reference to the drawings.

DETAILED DESCRIPTION OF PREFERRED EMBODIMENTS

First Embodiment

An article transport body according to a first embodiment will be described with reference to the drawings (FIGS. 1 to 5).

Figure 1:
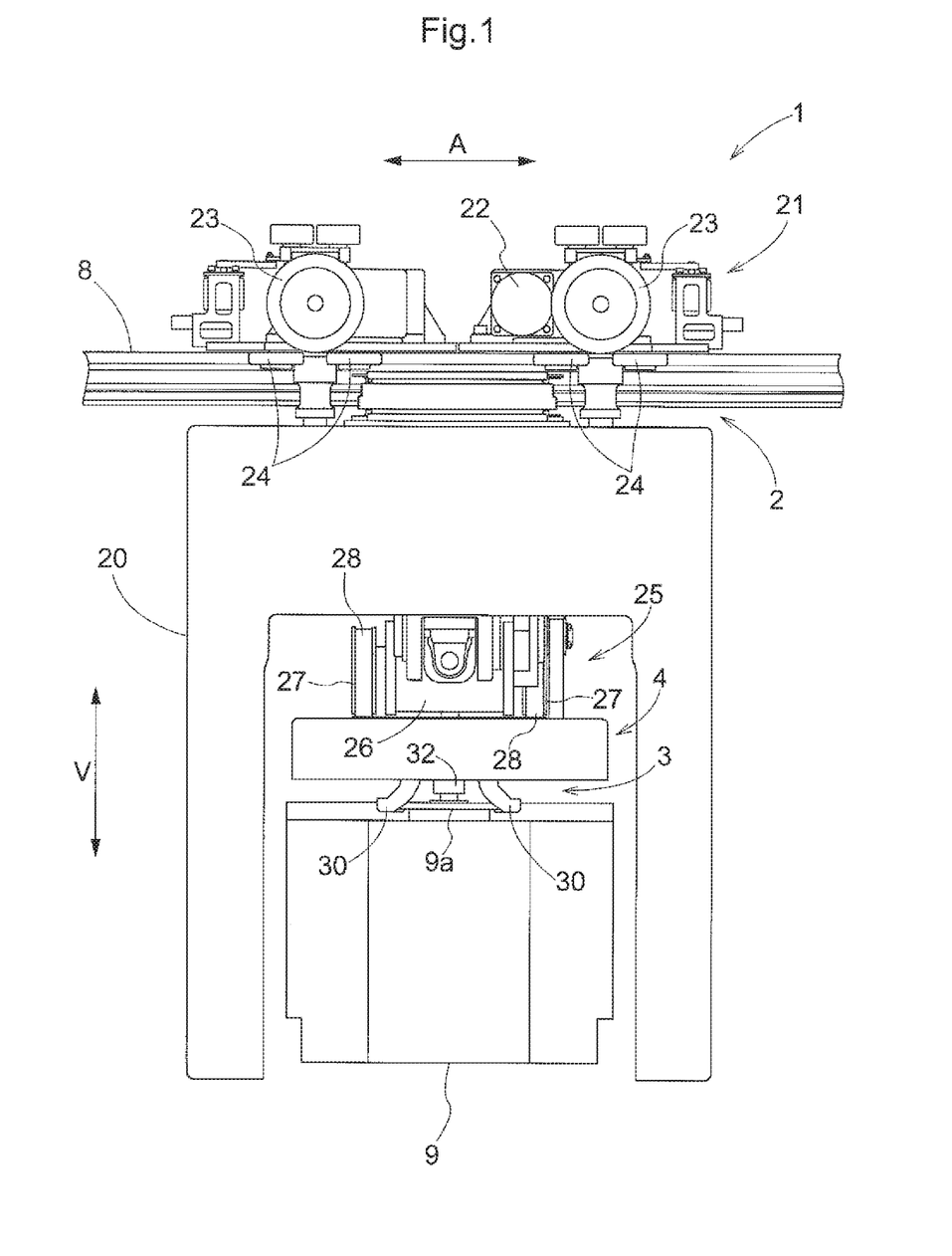
FIG. 1 is a side view of an article transport body according to a first embodiment.

As shown in FIG. 1, the article transport body 1 includes a travel portion 2, a holding portion 3 that holds an article 9, and a support portion 4 that supports the holding portion 3 relative to the travel portion 2. The travel portion 2 is configured to travel along a travel rail 8 (here, a pair of travel rails 8). Specifically, the traveling mechanism 21 included in the travel portion 2 includes travel wheels 23 that roll on the travel rails 8, a travel motor 22 (an example of a driving power source) that drives the travel wheels 23. The travel portion 2 travels along the travel rails 8 by the travel wheels 23 being driven by the travel motor 22. The traveling mechanism 21 includes guiding wheels 24 that guide the traveling of the travel portion 2 along the travel rails 8, and the travel portion 2 travels along the travel rails 8 in a state in which the guiding wheels 24 are in contact with, and guided by, the side surfaces of the travel rails 8. Thus, the traveling direction A of the travel portion 2 is the extension direction of the travel rails 8.

The travel rails 8 are fixed to the ceiling in a state in which they are suspended and supported from the ceiling. That is, the article transport body 1 is a ceiling guided vehicle that travels along the travel rails 8 provided on the ceiling side. The support portion 4 supports the holding portion 3 relative to the travel portion 2 such that the holding portion 3 is disposed on the lower side relative to the travel portion 2 (the lower side in a vertical direction V). Specifically, the support portion 4 is suspended and supported using the elevation mechanism 25 included in the travel portion 2.

The elevation mechanism 25 includes a transmission member 28 such as a belt or a wire, a winding body 27 around which the transmission member 28 is wound, and an elevating motor 26 (an example of a driving power source) that rotates the winding body 27. The support portion 4 (a first portion 41 described below) is coupled to a distal end portion of the transmission member 28 (see FIG. 2), and the transmission member 28 is wound or unwound by the winding body 27 being rotated in a forward or backward direction by the elevating motor 26, and, thereby, the support portion 4 is raised or lowered in a state in which it is suspended and supported using the transmission member 28. The elevation mechanism 25 raises and lowers the support portion 4 between a first height (the height shown in FIG. 1), which is the height of the travel portion 2 when traveling, and a second height that is lower than the first height and at which the article 9 is passed to and from a transfer target location of the article 9 (e.g., a load port of a processing device). The travel portion 2 includes a cover portion 20, and the upper side (the upper side in the vertical direction V) and both sides in the traveling direction A of the article 9 held on the holding portion 3 are covered by the cover portion 20 in a state in which the support portion 4 is located at the first height. Although the details will be described later, the holding portion 3 is coupled to the support portion 4 (a second portion 42 described below) that is supported so as to be suspended from the travel portion 2 in this manner. Accordingly, the holding portion 3 is supported by the support portion 4 so as to be suspended from the travel portion 2.

The holding portion 3 is configured to hold the article 9 from above. Here, the article 9 that is transported by the article transport body 1 is a container that houses a semiconductor wafer, and is specifically a front opening unified pod (FOUP). Also, the holding portion 3 includes a gripping portion 30 (here, a pair of gripping portions 30) that grips a flange portion 9a formed at the upper portion of the article 9. That is, the holding portion 3 holds the article 9 by gripping the article 9. A recess that is recessed downward is formed in the upper surface of the flange portion 9a, and the recess is configured such that an engaging portion 32 included in the holding portion 3 is fitted to the recess from above in a state in which the article 9 is gripped by the gripping portions 30. Accordingly, it is possible to improve the stability of holding the article 9 by the holding portion 3.

The holding portion 3 includes a gripping motor 31 (see FIG. 2) that switches the state of the gripping portions 30, and, by driving the gripping motor 31, the state of the gripping portions 30 is switched between a supporting state (the state shown in FIG. 1) in which the flange portion 9a is supported, and a releasing state in which the support for the flange portion 9a is released. Specifically, the state of the gripping portions 30 is switched from the releasing state to the supporting state by moving the pair of gripping portions 30 close to each other by switching at least one of the position and the orientation of each of the pair of gripping portions 30, and the state of the gripping portions 30 is switched from the supporting state to the releasing state by moving the pair of gripping portions 30 away from each other by switching at least one of the position and the orientation of each of the pair of gripping portions 30. When the article 9 is transferred from the article transport body 1 to the transfer target location, the state of the gripping portions 30 is switched from the supporting state to the releasing state in a state in which the support portion 4 is located at the above-described second height. When the article 9 is transferred from the transfer target location to the article transport body 1, the state of the gripping portions 30 is switched from the releasing state to the supporting state in a state in which the support portion 4 is located at the second height.

Figure 2:
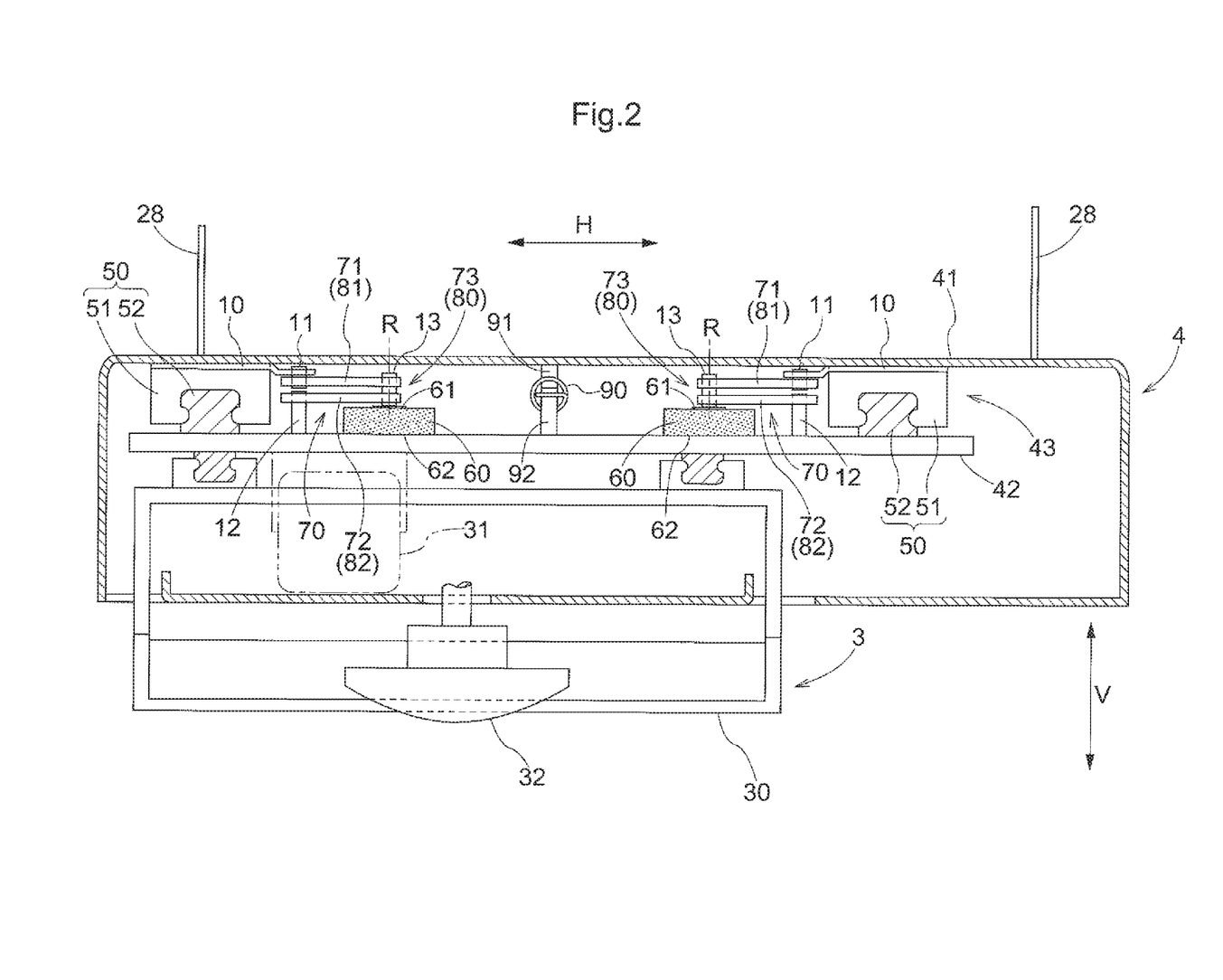
FIG. 2 is a longitudinal sectional front view of a support portion according to the first embodiment.

In the following, the configuration of the support portion, which is a main part of the present disclosure, will be described. As shown in FIG. 2, the support portion 4 includes a first portion 41 that is supported on the travel portion 2, a second portion 42 that is coupled to the holding portion 3, and a damper portion 43 that is provided between the first portion 41 and the second portion 42. As shown in FIG. 2, the first portion 41 is supported so as to be suspended from the travel portion 2 by the distal end portion of the transmission member 28 being coupled to the first portion 41. The first portion 41 is formed in a plate shape, and is supported on the travel portion 2 so as to be disposed in an orientation along a horizontal plane. Here, the support portion 4 includes a case that is formed in a box shape defining a housing space for the damper portion 43, and an upper wall portion (the portion covering the housing space from above) of the case constitutes the first portion 41.

The second portion 42 is disposed so as to oppose the first portion 41 in a direction (here, a direction orthogonal to a guiding direction G (described below)) that intersects the guiding direction G. Specifically, the second portion 42 is disposed on the lower side relative to the first portion 41 so as to oppose the first portion 41 in the vertical direction V. The second portion 42 is formed in a flat plate shape, and is supported on the first portion 41 so as to be disposed in an orientation along a horizontal plane. The second portion 42 is supported on the first portion 41 so as to be movable along the guiding direction G by a guide portion 50 (described below) included in the damper portion 43 in a state in which the movement of the second portion 42 relative to the first portion 41 in the vertical direction V and the horizontal direction H (a horizontal direction orthogonal to the guiding direction G) is restricted.

The second portion 42 supports the holding portion 3 by being coupled to the holding portion 3. As described above, the holding portion 3 includes the gripping portions 30, and the gripping portions 30 are coupled to the second portion 42 by being supported on the second portion 42 such that the state of the gripping portions 30 can be switched between the supporting state and the releasing state. As shown in FIG. 2, here, the pair of gripping portions 30 are supported on the second portion 42 so as to be capable of moving close to and away from each other using a linear motion mechanism including a guide rail and a guide block, the guide block being guided and supported by the guide rail.

Figure 3:
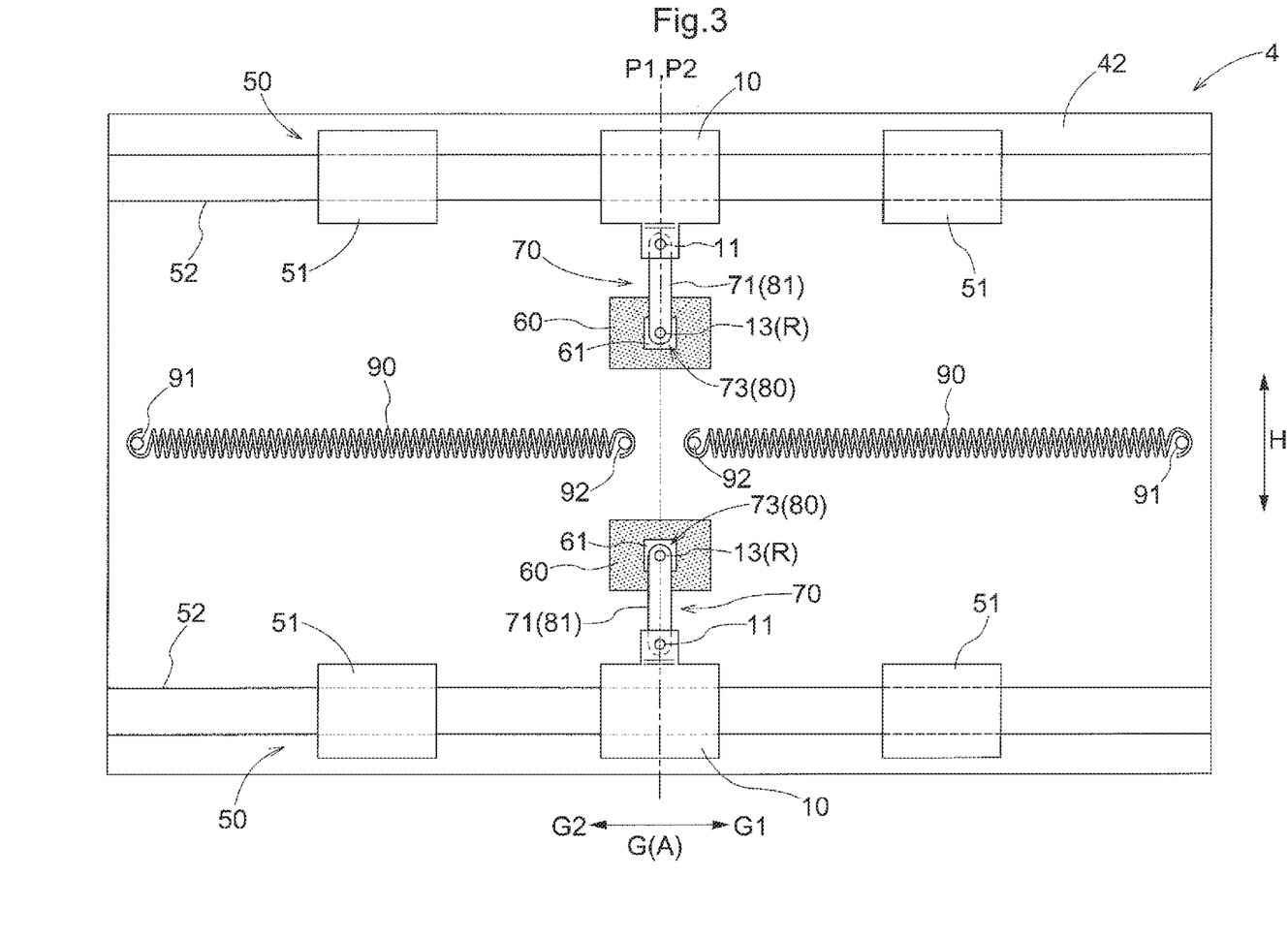
FIG. 3 is a transverse sectional plan view of the support portion according to the first embodiment.

As shown in FIGS. 2 and 3, the support portion 4 includes biasing members 90 for restoring the position of the first portion 41 relative to the second portion 42 to a neutral position (the position shown in FIG. 3) when the first portion 41 has moved along the guiding direction G relative to the second portion 42 (i.e., when the second portion 42 has moved along the guiding direction G relative to the first portion 41). The support portion 4 includes two types of biasing members 90, namely, a biasing member 90 that biases the first portion 41 relative to the second portion 42 to a guiding-direction first side G1, which is one side in the guiding direction G, and a biasing member 90 that biases the first portion 41 relative to the second portion 42 to a guiding-direction second side G2, which is the other side in the guiding direction G. Here, tension springs (tension coil springs) that extend and contract along the guiding direction G are used as the biasing members 90.

For the biasing member 90 that biases the first portion 41 relative to the second portion 42 to the guiding-direction first side G1, a hook provided at an end portion of the biasing member 90 on the guiding-direction second side G2 is engaged with a first fixed portion 91 fixed to the first portion 41, and a hook provided at an end portion thereof on the guiding-direction first side G1 is engaged with a second fixed portion 92 fixed to the second portion 42. For the biasing member 90 that biases the first portion 41 relative to the second portion 42 to the guiding-direction second side G2, a hook provided at an end portion of the biasing member 90 on the guiding-direction first side G1 is engaged with a first fixed portion 91 fixed at the first portion 41, and a hook provided at an end portion thereof on the guiding-direction second side G2 is engaged with a second fixed portion 92 fixed to the second portion 42. Then, a position at which the biasing forces of these two types of biasing members 90 are balanced is set as the neutral position. Accordingly, even when the first portion 41 has moved from the neutral position to either side in the guiding direction G relative to the second portion 42, the position of the first portion 41 relative to the second portion 42 is restored to the neutral position by these two types of biasing members 90.

As shown in FIG. 2, the damper portion 43 is provided between the first portion 41 and the second portion 42 in the vertical direction V. The damper portion 43 includes a guide portion 50, a link mechanism 70, and an elastic body 60. The guide portion 50 guides the movement of the first portion 41 relative to the second portion 42 along a specific guiding direction G. That is, the first portion 41 and the second portion 42 are configured to be relatively movable along the guiding direction G by the guide portion 50. Here, the damper portion 43 includes two guide portions 50 disposed at mutually different positions in the horizontal direction H. The two guide portions 50 are configured in the same manner except for their placement positions in the horizontal direction H, and, therefore, the two guide portions 50 will be described below without being differentiated from each other.

As shown in FIGS. 2 and 3, each guide portion 50 includes a guide rail 52 provided along the guiding direction G, and a guide block 51 that is guided and supported along the guiding direction G by the guide rail 52. The guide block 51 is fitted to the guide rail 52 such that the movement thereof relative to the guide rail 52 in directions (the vertical direction V, the horizontal direction H, etc.) orthogonal to the guiding direction G is restricted, and the first portion 41 and the second portion 42 are configured to be relatively movable along the guiding direction G in a state in which the relative movement thereof in directions orthogonal to the guiding direction G is restricted. Here, the guide portion 50 includes a pair of guide blocks 51 that are guided and supported by the guide rail 52 at mutually different positions in the guiding direction G. As shown in FIG. 3, the guide rail 52 is provided along the traveling direction A of the travel portion 2. That is, the guiding direction G is a direction along the traveling direction A.

As shown in FIG. 2, the guide blocks 51 are fixed to a surface (here, the lower surface of the first portion 41) of the first portion 41 that opposes the second portion 42, and the guide rail 52 is fixed to a surface (here, the upper surface of the second portion 42) of the second portion 42 that opposes the first portion 41. Unlike such a configuration, it is possible to adopt a configuration in which the guide rail 52 is fixed to a surface of the first portion 41 that opposes the second portion 42, and the guide blocks 51 are fixed to a surface of the second portion 42 that opposes the first portion 41. Alternatively, as the guide portion 50, it is possible to adopt a configuration other than the configuration in which the guide block 51 and the guide rail 52 are used.

The link mechanism 70 is coupled to each of the first portion 41 and the second portion 42, and is configured to move in conjunction with the movement of the first portion 41 relative to the second portion 42. That is, the link mechanism 70 is configured to move in conjunction with the relative movement between the first portion 41 and the second portion 42 along the guiding direction G. Also, the elastic body 60 is coupled to the link mechanism 70 so as to dampen the operation of the link mechanism 70. Accordingly, the transmission of vibration between the first portion 41 and the second portion 42 in the guiding direction G can be suppressed by the damper portion 43. As will be described below, the damper portion 43 includes a plurality of (specifically, two) link mechanisms 70, and an elastic body 60 is coupled to each of the link mechanisms 70. Note that the elastic body 60 includes a viscoelastic body that has viscosity in addition to elasticity. Using a viscoelastic body as the elastic body 60 makes it possible to easily enhance the vibration energy absorption performance (vibration dampening performance), thus suppressing the transmission of vibration between the first portion 41 and the second portion 42 in the guiding direction G. For example, a viscoelastic body formed from rubber such as an acrylic rubber or a urethane rubber can be used as the elastic body 60.

In the following, specific configurations of the link mechanism 70 and the elastic body 60 according to the present embodiment will be described. As shown in FIG. 3, the damper portion 43 includes two link mechanisms 70 disposed at mutually different positions in the horizontal direction H. The two link mechanisms 70 have configurations in which they are inverted to each other in the horizontal direction H (configurations having a mirror-symmetrical relationship with respect to a plane orthogonal to the horizontal direction H as a plane of symmetry), and, therefore, the two link mechanisms 70 will be described below without being differentiated from each other. Note that the number of link mechanisms 70 included in the damper portion 43 may be changed as appropriate, and the damper portion 43 may include only one link mechanism 70, or may include three or more link mechanisms 70.

As shown in FIGS. 2 and 3, each link mechanism 70 includes a first link body 71 and a second link body 72 that are coupled at a coupling portion 73 so as to be rotatable about a rotation axis R that intersects the guiding direction G. Here, the rotation axis R is an axis orthogonal to the guiding direction G. The support portion 4 is supported on the travel portion 2 such that the rotation axis R extends along the vertical direction V. The first link body 71 and the second link body 72 are rotatably coupled to each other at the coupling portion 73 via a third coupling member 13 (here, a coupling pin) disposed at the coupling portion 73 so as to extend along the rotation axis R.

The first link body 71 is rotatably coupled to the first portion 41 at a position different from the coupling portion 73. The first link body 71 is coupled to the first portion 41 so as to be rotatable about an axis parallel to the rotation axis R. Here, the first link body 71 is formed extending in a straight line when viewed in a vertical direction (see FIG. 3) along the vertical direction V. Also, when viewed in a vertical direction, the coupling portion 73 is formed at an end portion of the first link body 71, and the coupling portion between the first link body 71 and the first portion 41 is formed at the other end portion of the first link body 71. Specifically, the first link body 71 is rotatably coupled, via a first coupling member 11 (here, a coupling pin) disposed extending along an axis parallel to the rotation axis R, to an attachment member 10 fixed to the first portion 41. The attachment member 10 is fixed to the first portion 41 between the pair of guide blocks 51 in the guiding direction G. Note that it is possible to adopt a configuration in which the first link body 71 is rotatably coupled to the guide block 51 via the first coupling member 11, or a configuration in which the first link body 71 is rotatably coupled, via the first coupling member 11, to a portion of the first portion 41 at which the attachment member 10 or the guide block 51 is not fixed.

The second link body 72 is rotatably coupled to the second portion 42 at a position different from the coupling portion 73. The second link body 72 is coupled to the second portion 42 so as to be rotatable about an axis parallel to the rotation axis R. Here, the second link body 72 is formed extending in a straight line when viewed in a vertical direction. Also, when viewed in a vertical direction, the coupling portion 73 is formed at one end portion of the second link body 72, and the coupling portion between the second link body 72 and the second portion 42 is formed at the other end portion of the second link body 72. Specifically, the second link body 72 is rotatably coupled to the second portion 42 via a second coupling member 12 (here, a coupling pin) disposed extending along an axis parallel to the rotation axis R.

The coupling portion of the first link body 71 to the first portion 41 and the coupling portion of the second link body 72 to the second portion 42 are disposed at the same position in the horizontal direction H. That is, here, the first link body 71 and the second link body 72 are formed in straight lines having the same length when viewed in a vertical direction. Also, as shown in FIG. 3, the first link body 71 and the second link body 72 are disposed such that the relative angle therebetween about the rotation axis R is zero (i.e., such that they overlap each other when viewed in a vertical direction) in a state in which the position of the first portion 41 relative to the second portion 42 is at the neutral position.

Figure 4:
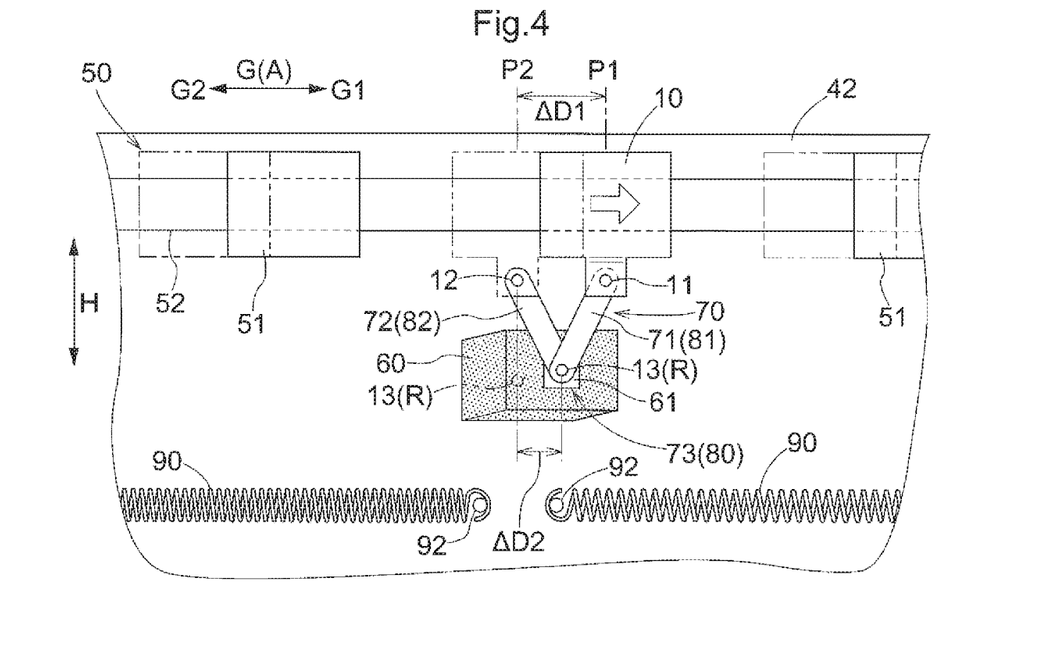
FIG. 4 is a diagram showing a state in which a first portion of the support portion according to the first embodiment is displaced to a guiding-direction first side relative to a second portion.
Figure 5:
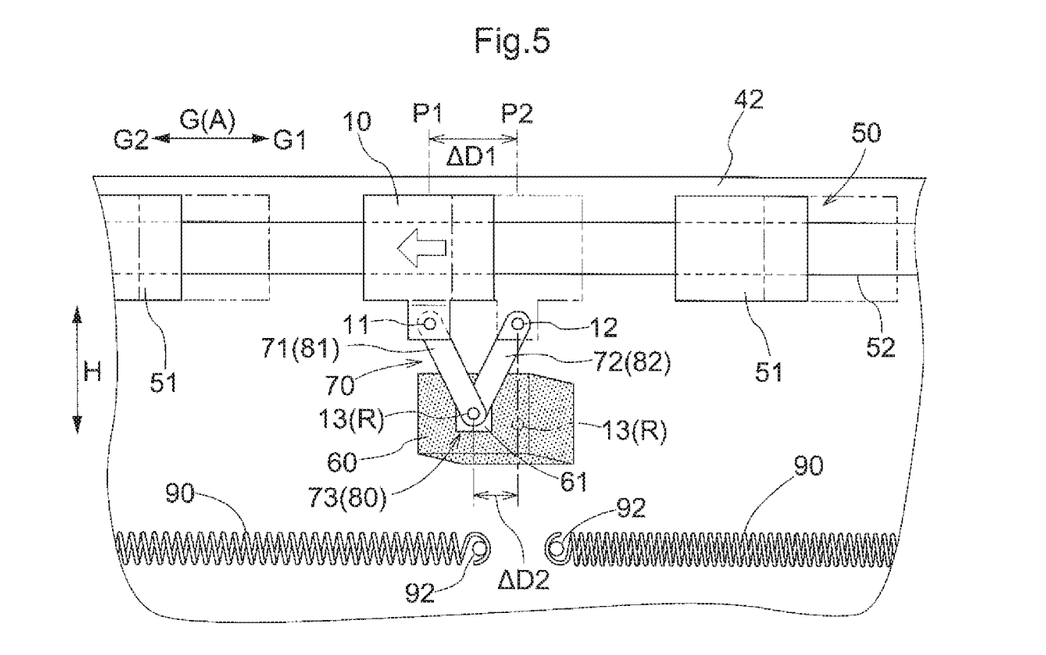
FIG. 5 is a diagram showing a state in which the first portion of the support portion according to the first embodiment is displaced to a guiding-direction second side relative to the second portion.

Since the link mechanisms 70 are configured in this manner, when the first portion 41 has moved to the guiding-direction first side G1 relative to the second portion 42 (i.e., when the second portion 42 has moved to the guiding-direction second side G2 relative to the first portion 41) as shown in FIG. 4, the amount of displacement of the coupling portion 73 to the guiding-direction first side G1 relative to the second portion 42 is half the value of the amount of displacement of the first portion 41 to the guiding-direction first side G1 relative to the second portion 42. When the first portion 41 has moved to the guiding-direction second side G2 relative to the second portion 42 (i.e., when the second portion 42 has moved to the guiding-direction first side G1 relative to the first portion 41) as shown in FIG. 5, the amount of displacement of the coupling portion 73 to the guiding-direction second side G2 relative to the second portion 42 is half the value of the amount of displacement of the first portion 41 to the guiding-direction second side G2 relative to the second portion 42. That is, even when the first portion 41 is displaced to either side in the guiding-direction G relative to the second portion 42 as shown in FIGS. 4 and 5, a second displacement amount $\Delta D2$, which is an amount of movement of the coupling portion 73 along the guiding direction G relative to the second portion 42, is half the value of a first displacement amount $\Delta D1$, which is an amount of displacement of the first portion 41 along the guiding direction G relative to the second portion 42.

In FIGS. 3 to 5, "P1" indicates the position of the first portion 41 in the guiding direction G (here, the position of the first coupling member 11), and "P2" indicates the position of the second portion 42 in the guiding direction G (here, the position of the second coupling member 12). In FIGS. 4 and 5, the respective positions of the attachment member 10, the guide block 51, and the third coupling member 13 when the position of the first portion 41 relative to the second portion 42 is at the neutral position are indicated by the dashed double-dotted lines.

Thus, the amount of displacement (second displacement amount ΔD2) of the coupling portion 73 along the guiding direction G relative to the second portion 42 when the first portion 41 has moved along the guiding direction G relative to the second portion 42 is half the value of the amount of displacement (first displacement amount ΔD1) of the first portion 41 along the guiding direction G relative to the second portion 42. Since the first portion 41 does not move in the horizontal direction H relative to the second portion 42, the first displacement amount ΔD1 is equal to the amount of displacement (here, the amount of displacement in a horizontal plane) of the first portion 41 relative to the second portion 42 when the first portion 41 has moved along the guiding direction G relative to the second portion 42. On the other hand, although the coupling portion 73 moves in the horizontal direction H relative to the second portion 42, the amount of displacement (here, the amount displacement in a horizontal plane) of the coupling portion 73 relative to the second portion 42 when the first portion 41 has moved along the guiding direction G relative to the second portion 42 is smaller than the amount of displacement of the first portion 41 relative to the second portion 42. In a state in which the position of the first portion 41 relative to the second portion 42 is in the vicinity of the neutral position, the amount of displacement of the coupling portion 73 relative to the second portion 42 is about half the value of the amount of displacement of the first portion 41 relative to the second portion 42. That is, each link mechanism 70 includes a coupling portion 73 whose amount of displacement relative to the second portion 42 is smaller than the amount of displacement of the first portion 41 relative to the second portion 42 when the first portion 41 has moved along the guiding direction G relative to the second portion 42.

Thus, the link mechanism 70 includes a low displacement portion 80 whose amount of displacement relative to the second portion 42 is smaller than the amount of displacement of the first portion 41 relative to the second portion 42 when the first portion 41 has moved along the guiding direction G relative to the second portion 42. Also, the elastic body 60 is coupled to the low displacement portion 80. Here, the elastic body 60 is coupled to the coupling portion 73, which is the low displacement portion 80.

Specifically, as shown in FIG. 2, each elastic body 60 includes a first coupling portion 61, which is a portion coupled so as to move integrally with the low displacement portion 80 (here, the coupling portion 73), and a second coupling portion 62, which is a portion coupled so as to move integrally with one of the first portion 41 and the second portion 42 (here, the second portion 42). The coupling between the elastic body 60 and its coupling target portion (e.g., the coupling between the second coupling portion 62 and the second portion 42) can be achieved through adhesive fixation, for example. The coupling between the elastic body 60 and its coupling target portion can also be suitably achieved through fastening fixation using a bolt or the like. The first coupling portion 61 is formed on a surface (here, the upper surface of the elastic body 60) of the elastic body 60 that opposes the first portion 41, and the second coupling portion 62 is formed on a surface (here, the lower surface of the elastic body 60) of the elastic body 60 that opposes the second portion 42. The elastic body 60 is formed in a plate shape (here, a rectangular plate shape when viewed in a vertical direction) whose thickness direction coincides with the vertical direction V, and a shear load along the guiding direction G acts on the elastic body 60 when the first portion 41 has moved along the guiding direction G relative to the second portion 42.

The low displacement portion 80 is a portion (a portion of the link mechanism 70) whose amount of displacement relative to the second portion 42 is smaller than the amount of displacement of the first portion 41 relative to the second portion 42. Accordingly, as a result of the elastic body 60 being coupled to the low displacement portion 80 in this manner, the deformation amount of the elastic body 60 is smaller than the amount of displacement (the first displacement amount ΔD1) of the first portion 41 relative to the second portion 42 when the first portion 41 has moved along the guiding direction G relative to the second portion 42 as shown in FIGS. 4 and 5. Specifically, the deformation amount of the elastic body 60 is a relatively small amount corresponding to the amount of displacement of the low displacement portion 80 (coupling portion 73) relative to the second portion 42. To put more simply, as shown in FIGS. 4 and 5, the deformation amount of the elastic body 60 along the guiding direction G (deformation amount due to a shear load) is about the same as the above-described second displacement amount ΔD2.

Thus, the elastic body 60 is coupled to the link mechanism 70 such that the deformation amount of the elastic body 60 is smaller than the amount of displacement of the first portion 41 relative to the second portion 42 when the first portion 41 has moved along the guiding direction G relative to the second portion 42. Accordingly, the space required for placement of the elastic body 60 can be kept small as compared with a case where the deformation amount of the elastic body 60 is the same as, or larger than the amount of displacement of the first portion 41 relative to the second portion 42. Furthermore, even an elastic body 60 that has a smaller deformation amount under a load than the required deformation amount can easily be used appropriately.

Although the second coupling portion 62 of the elastic body 60 here is coupled so as to move integrally with the second portion 42, it is possible to adopt a configuration in which the second coupling portion 62 is coupled so as to move integrally with the first portion 41. In this case, the deformation amount of the elastic body 60 when the first portion 41 has moved along the guiding direction G relative to the second portion 42 is a deformation amount corresponding to the amount of displacement of the first portion 41 relative to the low displacement portion 80 (coupling portion 73). Although both the first link body 71 and the second link body 72 are configured to be rotatable about the rotation axis R relative to the elastic body 60 here, the elastic body 60 may be actively subjected to torsional deformation by coupling one of the first link body 71 and the second link body 72 to the elastic body 60 so as to be rotatable integrally with the elastic body 60 about the rotation axis R. Although the elastic body 60 is configured to be coupled to the coupling portion 73 here, the elastic body 60 may be configured to be coupled to a low displacement portion 80 (e.g., an intermediate portion of the first link body 71 or the second link body 72) of the link mechanism 70 other than the coupling portion 73.

Second Embodiment

An article transport body according to a second embodiment will be described with reference to the drawings (FIGS. 6 to 9). In the present embodiment, the coupling structure of an elastic body 60 to a link mechanism 70 is different from that of the first embodiment described above. The following description of the article transport body according to the present embodiment focuses on the difference from the first embodiment. Components that are not specifically described are the same as those of the first embodiment, and are denoted by the same reference numerals, with detailed descriptions thereof omitted.

Figure 7:
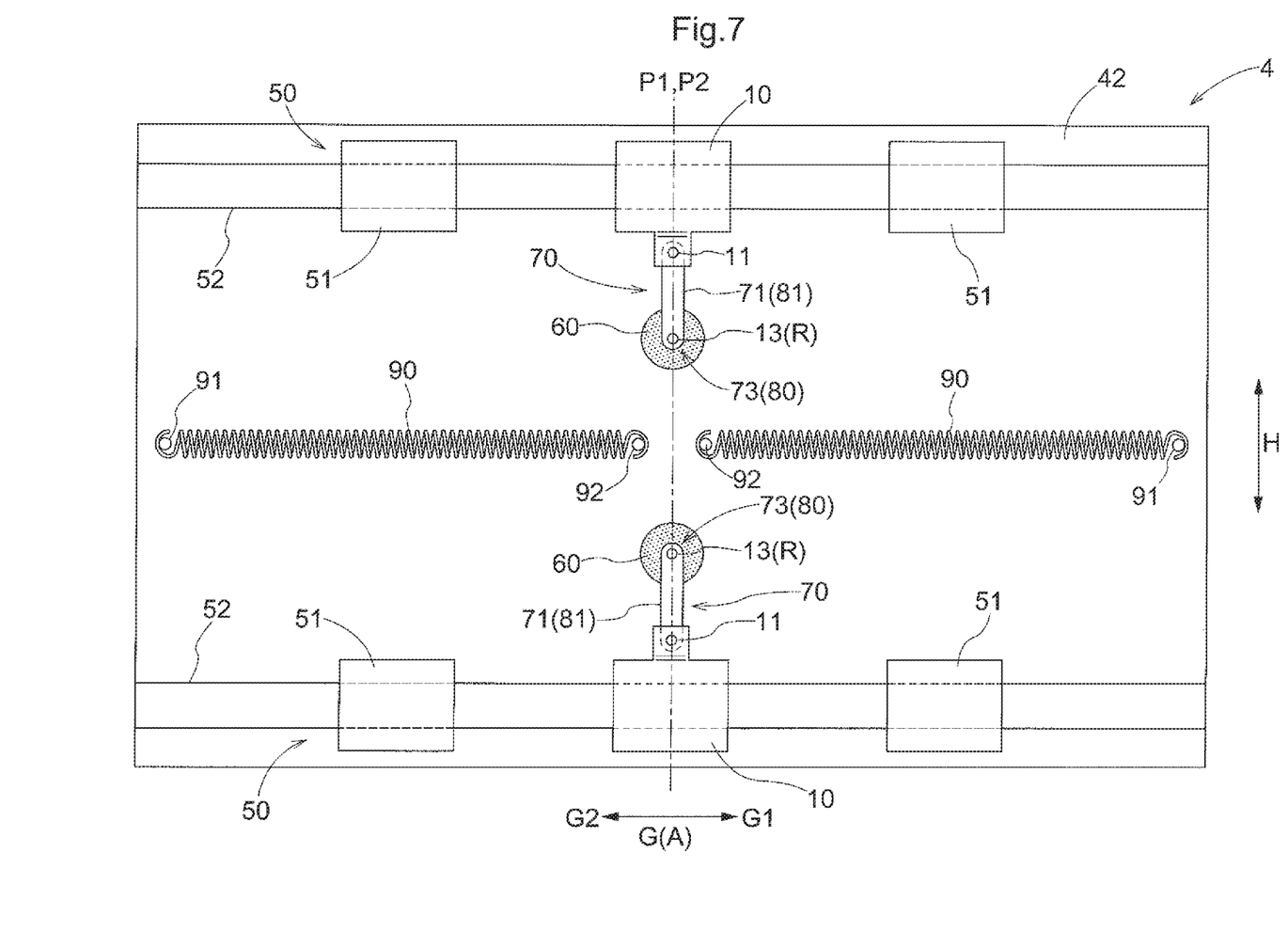
FIG. 7 is a transverse sectional plan view of the support portion according to the second embodiment.
Figure 8:
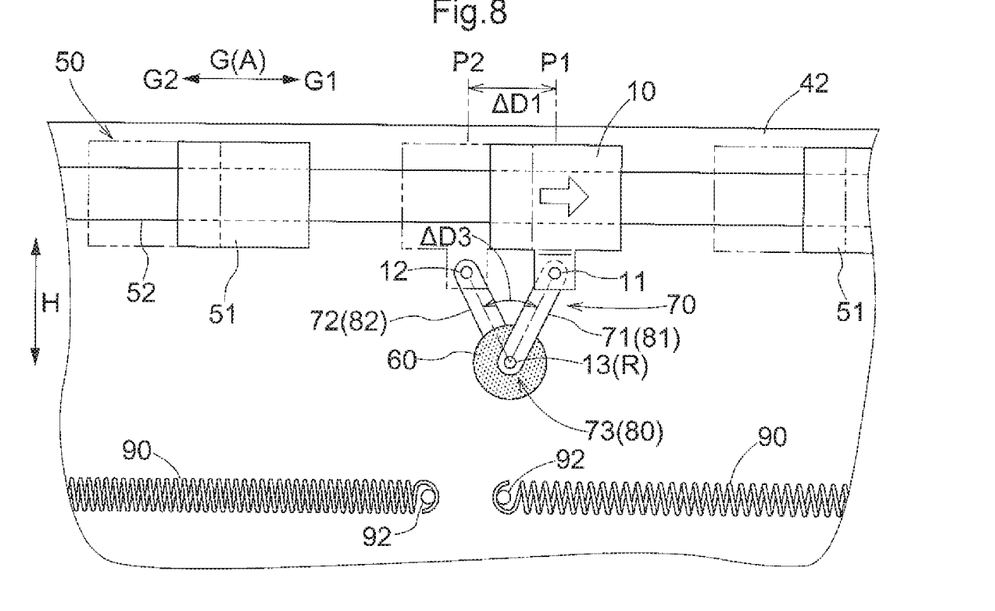
FIG. 8 is a diagram showing a state in which a first portion of the support portion according to the second embodiment is displaced to a guiding-direction first side relative to a second portion.
Figure 9:
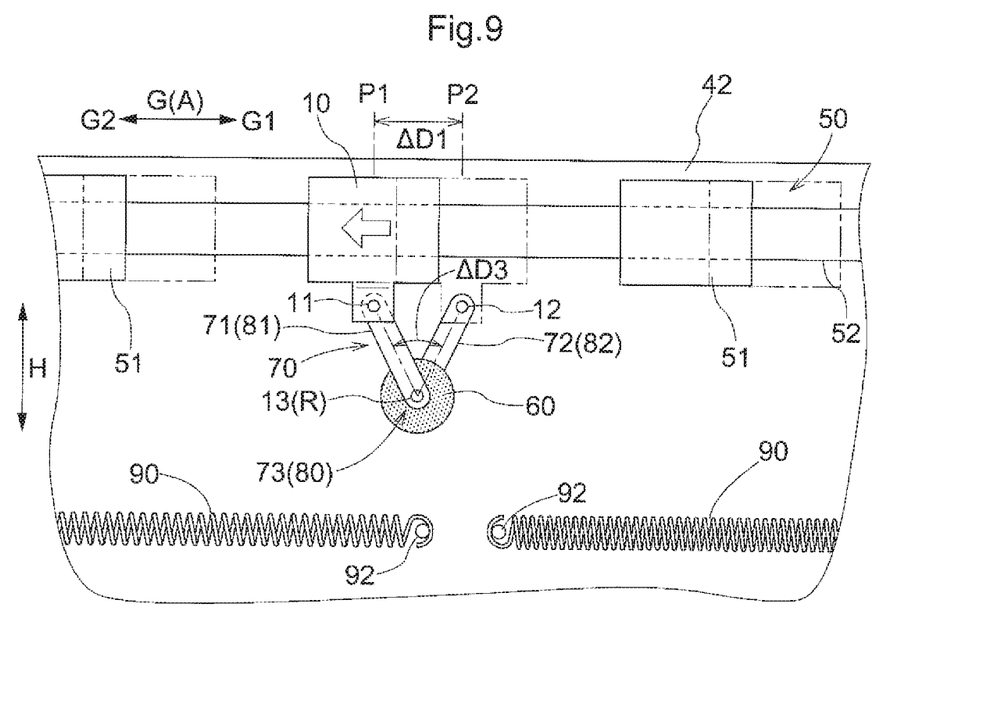
FIG. 9 is a diagram showing a state in which the first portion of the support portion according to the second embodiment is displaced to a guiding-direction second side relative to the second portion.

The article transport body 1 of the present embodiment includes a link mechanism 70 having the same configuration as that of the first embodiment described above. That is, the link mechanism 70 includes a first link body 71 and a second link body 72 that are coupled rotatably about a rotation axis R intersecting a guiding direction G. As shown in FIGS. 7 to 9, the first link body 71 and the second link body 72 relatively rotate about the rotation axis R when a first portion 41 has moved along the guiding direction G relative to a second portion 42. That is, the link mechanism 70 includes a first member 81 and a second member 82 that relatively rotate about the rotation axis R intersecting the guiding direction G when the first portion 41 has moved along the guiding direction G relative to the second portion 42. Here, the first link body 71 is the first member 81, and the second link body 72 is the second member 82. Note that FIGS. 6 to 9 are drawings corresponding to FIGS. 2 to 5 of the first embodiment described above.

Figure 6:
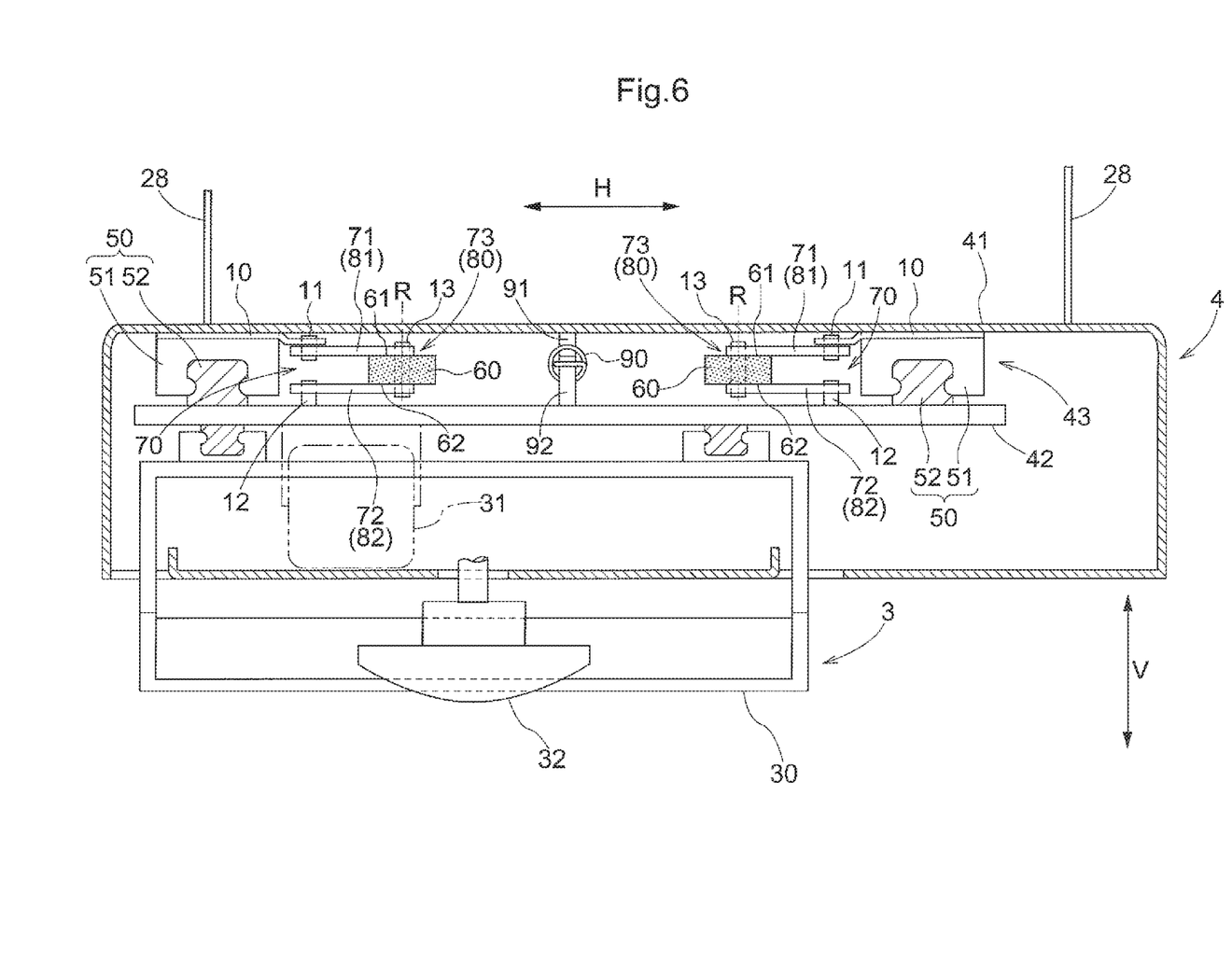
FIG. 6 is a longitudinal sectional front view of a support portion according to a second embodiment.

As shown in FIG. 6, the elastic body 60 includes a first coupling portion 61, which is a portion coupled integrally to the first member 81 (here, the first link body 71), and a second coupling portion 62, which is a portion coupled integrally to the second member 82 (here, the second link body 72). Specifically, as in the first embodiment described above, the elastic body 60 is coupled to a coupling portion 73. The first coupling portion 61 is formed on a surface (here, the upper surface of the elastic body 60) of the elastic body 60 that opposes the first portion 41, and the second coupling portion 62 is formed on a surface (here, the lower surface of the elastic body 60) of the elastic body 60 that opposes the second portion 42. The elastic body 60 is coupled at the first coupling portion 61 so as to rotate integrally with the first member 81 about the rotation axis R, and is coupled at the second coupling portion 62 so as to rotate integrally with the second member 82 about the rotation axis R.

The elastic body 60 is formed in a plate shape (here, a circular plate shape when viewed in a vertical direction) whose thickness direction coincides with a vertical direction V, and a torsional load about the rotation axis R acts on the elastic body 60 when the first portion 41 has moved along the guiding direction G relative to the second portion 42. That is, as shown in FIGS. 8 and 9, the deformation amount (deformation amount due to a torsional load) of the elastic body 60 when the first portion 41 has moved along the guiding direction G relative to the second portion 42 is a deformation amount corresponding to a third displacement amount $\Delta D3$, which is a relative rotation amount (relative rotational displacement amount, relative angle displacement amount) between the first member 81 and the second member 82 about the rotation axis R.

To put more simply, a deformation amount corresponding to the third displacement amount $\Delta D3$ of the elastic body 60 can be viewed as an amount of deformation about the rotation axis R on the outer circumferential surface (the outer circumferential surface when viewed in a vertical direction) of the elastic body 60 (a value obtained by multiplying the radius of the outer circumferential surface by the third displacement amount $\Delta D3$). When viewed in this way, it can be clearly seen from FIGS. 8 and 9 that the deformation amount (deformation amount corresponding to the third displacement amount $\Delta D3$) of the elastic body 60 when the first portion 41 has moved along the guiding direction G relative to the second portion 42 can be made smaller than the amount of displacement (first displacement amount $\Delta D1$) of the first portion 41 relative to the second portion 42. That is, in the present embodiment as well, the deformation amount of the elastic body 60 when the first portion 41 has moved along the guiding direction G relative to the second portion 42 is smaller than the amount of displacement of the first portion 41 relative to the second portion 42, as in the case of the first embodiment described above.

Here, a configuration is adopted in which the first link body 71 is the first member 81, and the second link body 72 is the second member 82 (i.e. a configuration in which the coupling portion (to which the elastic body 60 is coupled) between the first member 81 and the second member 82 is the coupling portion 73 between the first link body 71 and the second link body 72). However, it is possible to adopt a configuration in which the coupling portion (to which the elastic body 60 is coupled) between the first member 81 and the second member 82 is not the coupling portion 73. For example, it is possible to adopt a configuration in which the first link body 71 is the first member 81, and the first portion 41 is the second member 82 (i.e., a configuration in which the elastic body 60 is coupled to the coupling portion between the first link body 71 and the first portion 41 that relatively rotate about a rotation axis coaxial with the first coupling member 11), or a configuration in which the second link body 72 is the first member 81, and the second portion 42 is the second member 82 (i.e., a configuration in which the elastic body 60 is coupled to the coupling portion between the second link body 72 and the second portion 42 that relatively rotate about a rotation axis coaxial with the second coupling member 12). Although a configuration is adopted here in which the elastic body 60 is formed in a plate shape whose thickness direction coincides with the vertical direction V, it is possible to adopt, for example, a configuration in which the elastic body 60 is formed in a cylindrical shape extending in the vertical direction V.

OTHER EMBODIMENTS

Next, other embodiments of the article transport body will be described.

(1) The configuration of the link mechanism 70 described in the above embodiments is merely an example, and the configuration of the link mechanism 70 may be changed as appropriate. For example, in the above embodiments, the link mechanism 70 is configured such that the amount of displacement (second displacement amount $\Delta D2$) of the coupling portion 73 relative to the second portion 42 along the guiding direction G when the first portion 41 has moved along the guiding direction G relative to the second portion 42 is half the value of the amount of displacement (first displacement amount $\Delta D1$) of the first portion 41 relative to the second portion 42 along the guiding direction G. However, the link mechanism 70 may be configured such that the second displacement amount $\Delta D2$ is a value different from half the first displacement amount $\Delta D1$. Although the above embodiments have adopted a configuration in which the link mechanism 70 includes only two link bodies (arms), it is possible to adopt a configuration in which the link mechanism 70 includes a link body in addition to the first link body 71 and the second link body 72. In this case, it is possible to adopt, for example, a configuration in which the first link body 71 is coupled to the first portion 41 via another link body, or a configuration in which the second link body 72 is coupled to the second portion 42 via another link body.

(2) The above embodiments have described, as an example, a configuration in which the elastic body 60 is coupled to the link mechanism 70 such that the deformation amount of the elastic body 60 is smaller than the amount of displacement of the first portion 41 relative to the second portion 42 when the first portion 41 has moved along the guiding direction G relative to the second portion 42. However, the present invention is not limited to such a configuration, and it is possible to adopt a configuration in which the elastic body 60 is coupled to the link mechanism 70 such that the deformation amount of the elastic body 60 is larger than the amount of displacement of the first portion 41 relative to the second portion 42 when the first portion 41 has moved along the guiding direction G relative to the second portion 42.

(3) The above embodiments have described, as an example, a configuration in which the holding portion 3 holds the article 9 from above, specifically, a configuration in which the holding portion 3 includes the gripping portion 30 that grips the flange portion 9a of the article 9. However, the present invention is not limited to such a configuration, and it is possible to adopt, for example, a configuration in which the holding portion 3 holds the article 9 from below. Specifically, it is possible to adopt a configuration in which the holding portion 3 includes a support portion that supports the article 9 from below. That is, it is possible to adopt a configuration in which the holding portion 3 holds the article 9 by supporting (supporting from below) the article 9. In such a case, it is possible to adopt a configuration in which a portion of the holding portion 3 that holds the article 9 is formed as one piece with the second portion 42, and, thereby, the second portion 42 is coupled to the holding portion 3 (e.g., a configuration in which a surface of the second portion 42 that is opposite to the side opposing the first portion 41 functions as the holding portion (support portion) for the article 9).

(4) The above embodiments have described, as an example, a configuration in which the support portion 4 supports the holding portion 3 relative to the travel portion 2 such that the holding portion 3 is disposed on the lower side relative to the travel portion 2. However, the present invention is not limited to such a configuration, and it is possible to adopt a configuration in which the support portion 4 supports the holding portion 3 relative to the travel portion 2 such that the holding portion 3 is disposed on the upper side relative to the travel portion 2. That is, unlike the configuration in which the holding portion 3 is supported by the support portion 4 so as to be suspended from the travel portion 2 as in the above embodiments, it is possible to adopt a configuration in which the holding portion 3 is supported on the travel portion 2 from below by the support portion 4. In the case of adopting such a configuration, the second portion 42 may be disposed on the upper side relative to the first portion 41, unlike in the case of the above embodiments.

(5) The above embodiments have described, as an example, a configuration in which the guiding direction G is a direction along the traveling direction A of the travel portion 2. However, the present invention is not limited to such a configuration, and it is possible to adopt a configuration in which the guiding direction G is a direction along a direction (e.g., a horizontal direction orthogonal to the traveling direction A) other than the traveling direction A.

(6) The above embodiments have described, as an example, a configuration in which the article transport body 1 is a ceiling guided vehicle that travels along the travel rail 8 provided on the ceiling side. However, the present invention is not limited to such a configuration, and it is possible to adopt, for example, a configuration in which the article transport body 1 is a floor-traveling article transport vehicle that travels along a travel rail 8 provided on the floor surface. When the article transport body 1 is a floor-traveling article transport vehicle as in this case, it is possible to adopt a configuration in which no travel rail 8 is provided, or in other words, a configuration in which the travel portion 2 travels without moving along the travel rail 8 (i.e., without being guided by the travel rail 8).

(7) The above embodiments have described, as an example, a configuration in which the article 9 is a FOUP. However, the present invention is not limited to such a configuration, and it is possible to adopt a configuration in which the article 9 is a container that houses a reticle, a container that houses a glass substrate, or the like. Alternatively, the article 9 may be an article other than a container.

(8) Note that the configuration disclosed in each of the embodiments described above is applicable in combination with configurations disclosed in other embodiments (including combinations of the embodiments described as Other Embodiments) as long as no inconsistency arises. With regard to the other configurations as well, the embodiments disclosed herein are illustrative in all respects. Therefore, various modifications and alterations may be made as appropriate without departing from the gist of the present disclosure.

Outline of the Embodiment

The following describes an outline of the article transport body described above.

An article transport body includes: a travel portion; a holding portion that holds an article; and a support portion that supports the holding portion relative to the travel portion; wherein the support portion includes: a first portion that is supported on the travel portion; a second portion that is coupled to the holding portion; and a damper portion that is provided between the first portion and the second portion, the damper portion includes: a guide portion that guides movement of the first portion relative to the second portion along a specific guiding direction; a link mechanism that is coupled to each of the first portion and the second portion, and that moves in conjunction with movement of the first portion relative to the second portion; and an elastic body, and the elastic body is coupled to the link mechanism so as to dampen operation of the link mechanism.

With this configuration, the damper portion provided between the first portion and the second portion includes the guide portion that guides the movement of the first portion relative to the second portion along a specific guiding direction, the link mechanism that moves in conjunction with the movement of the first portion relative to the second portion, and the elastic body, and the elastic body is coupled to the link mechanism so as to dampen the operation of the link mechanism. Accordingly, the transmission of vibration between the first portion and the second portion along the guiding direction can be suppressed by the damper portion. Since the elastic body is coupled to the link mechanism so as to dampen the operation of the link mechanism at this time, the effect of converting the displacement amount or the displacement direction by the link mechanism can make the deformation amount of the elastic body different from the amount of displacement of the first portion relative to the second portion, or make the deformation direction of the elastic body different from the displacement direction (i.e., the guiding direction) of the first portion relative to the second portion. Accordingly, unlike a case where the elastic body is sandwiched between the first portion and the second portion, the elastic deformability required for the elastic body can be adjusted using the configuration of the link mechanism, the coupling configuration of the elastic body to the link mechanism, and the like, and it is thus possible to reduce the constraints on the elastic deformability required for the elastic body. Since the first portion is supported on the travel portion, and the second portion is coupled to the holding portion that holds an article in the above-described configuration, the transmission of vibration in the guiding direction from the travel portion side to the article held on the holding portion can be suppressed using the elastic body.

Thus, with the above-described configuration, it is possible to reduce the constrains on the elastic deformability required for an elastic body when the elastic body is used to suppress the transmission of vibration from the travel portion side to an article held on the holding portion.

Here, it is preferable that the elastic body is coupled to the link mechanism such that a deformation amount of the elastic body is smaller than an amount of displacement of the first portion relative to the second portion when the first portion has moved along the guiding direction relative to the second portion.

With this configuration, the space required for placement of the elastic body can be kept small as compared with a case where the deformation amount of the elastic body is the same as, or larger than the amount of displacement of the first portion relative to the second portion. Furthermore, even an elastic body that has a smaller deformation amount under a load than the required deformation amount can easily be used appropriately.

It is preferable that the link mechanism includes a low displacement portion whose amount of displacement relative to the second portion is smaller than an amount of displacement of the first portion relative to the second portion when the first portion has moved along the guiding direction relative to the second portion, and the elastic body includes a portion that is coupled so as to move integrally with the low displacement portion, and a portion that is coupled so as to move integrally with one of the first portion and the second portion.

With this configuration, the deformation amount of the elastic body when the first portion has moved along the guiding direction relative to the second portion can be a deformation amount corresponding to a displacement amount (specifically, an amount of displacement of the low displacement portion relative to the second portion, or an amount of displacement of the first portion relative to the low displacement portion) that is smaller than the amount of displacement of the first portion relative to the second portion. Accordingly, the above-described configuration in which the deformation amount of the elastic body is smaller than the amount of displacement of the first portion relative to the second portion can be realized appropriately.

It is preferable that the link mechanism includes a first member and a second member that rotate relatively about a rotation axis intersecting the guiding direction when the first portion has moved along the guiding direction relative to the second portion, and the elastic body includes a portion that is coupled integrally to the first member, and a portion that is coupled integrally to the second member.

With this configuration, the deformation amount of the elastic body when the first portion has moved along the guiding direction relative to the second portion can be a relatively small deformation amount corresponding to the relative rotation amount between the first member and the second member about the rotation axis. Accordingly, the above-described configuration in which the deformation amount of the elastic body is smaller than the amount of displacement of the first portion relative to the second portion can be realized appropriately.

It is preferable that the link mechanism includes a first link body and a second link body that are coupled at a coupling portion so as to be rotatable about a rotation axis intersecting the guiding direction, the first link body is rotatably coupled to the first portion at a position different from the coupling portion, the second link body is rotatably coupled to the second portion at a position different from the coupling portion, and the elastic body is coupled to the coupling portion.

With this configuration, it is possible to appropriately provide the link mechanism so as to move in conjunction with the movement of the first portion relative to the second portion, while making the configuration of the link mechanism relatively simple. For example, by using the coupling portion as the low displacement portion described above, or using the first link body and the second link body as the first member and the second member described above, it is possible to appropriately realize the above-described configuration in which the deformation amount of the elastic body is smaller than the amount of displacement of the first portion relative to the second portion.

It is preferable that the guiding direction is a direction along a traveling direction of the travel portion.

In general, due to acceleration, deceleration, or the like, a relatively large vibration in the traveling direction may occur in the travel portion. With this configuration, the traveling direction is set to a direction in which vibration is to be suppressed by the damper portion, and it is therefore possible to appropriately suppress the transmission of a large vibration from the travel portion side to an article held on the holding portion.

It is preferable that the holding portion is supported by the support portion so as to be suspended from the travel portion.

With such a configuration, the holding portion and an article held on the holding portion are supported in a state in which they are suspended relative to the travel portion, and, therefore, the holding portion tends to be oscillated by vibration caused by acceleration, deceleration, or the like of the travel portion. Accordingly, when the holding portion is supported so as to be suspended from the travel portion in this way, the transmission of vibration from the travel portion side to the article held on the holding portion can be particularly effectively suppressed using the above-described configuration.

It is sufficient that the article transport body according to the present disclosure can achieve at least one of the above-described effects.

What is claimed is:

1. An article transport body comprising:
   a travel portion;
   a holding portion that holds an article; and
   a support portion that supports the holding portion relative to the travel portion;
   wherein the support portion includes:
   a first portion that is supported on the travel portion; a second portion that is coupled to the holding portion; and
   a damper portion that is provided between the first portion and the second portion, wherein the damper portion includes:

a guide portion that guides movement of the first portion relative to the second portion along a specific guiding direction;

a link mechanism that is coupled to each of the first portion and the second portion, and that moves in conjunction with movement of the first portion relative to the second portion; and an elastic body, wherein the elastic body is coupled to the link mechanism so as to dampen operation of the link mechanism, wherein the link mechanism includes a low displacement portion whose amount of displacement relative to the second portion in the guiding direction is smaller than an amount of displacement of the first portion relative to the second portion in the guiding direction when the first portion has moved along the guiding direction relative to the second portion, and wherein the elastic body includes a portion that is coupled so as to move integrally with the low displacement portion, and a portion that is coupled so as to move integrally with one of the first portion and the second portion.

2. The article transport body according to claim 1, wherein the guiding direction is a direction along a traveling direction of the travel portion.

3. The article transport body according to claim 1, wherein the holding portion is supported by the support portion so as to be suspended from the travel portion.

4. An article transport body comprising:

a travel portion;

a holding portion that holds an article; and a support portion that supports the holding portion relative to the travel portion;

wherein the support portion includes:

a first portion that is supported on the travel portion; a second portion that is coupled to the holding portion; and a damper portion that is provided between the first portion and the second portion, wherein the damper portion includes:

a guide portion that guides movement of the first portion relative to the second portion along a specific guiding direction;

a link mechanism that is coupled to each of the first portion and the second portion, and that moves in conjunction with movement of the first portion relative to the second portion; and an elastic body, wherein the elastic body is coupled to the link mechanism so as to dampen operation of the link mechanism, wherein the link mechanism includes a first member and a second member that rotate relatively about a rotation axis intersecting the guiding direction when the first portion has moved along the guiding direction relative to the second portion, and wherein the elastic body includes a portion that is coupled integrally to the first member, and a portion that is coupled integrally to the second member.

5. An article transport body comprising:

a travel portion;

a holding portion that holds an article; and a support portion that supports the holding portion relative to the travel portion;

wherein the support portion includes:

a first portion that is supported on the travel portion; a second portion that is coupled to the holding portion; and a damper portion that is provided between the first portion and the second portion, wherein the damper portion includes:

a guide portion that guides movement of the first portion relative to the second portion along a specific guiding direction;

a link mechanism that is coupled to each of the first portion and the second portion, and that moves in conjunction with movement of the first portion relative to the second portion; and an elastic body, wherein the elastic body is coupled to the link mechanism so as to dampen operation of the link mechanism, wherein the link mechanism includes a first link body and a second link body that are coupled at a coupling portion so as to be rotatable about a rotation axis intersecting the guiding direction, wherein the first link body is rotatably coupled to the first portion at a position different from the coupling portion, wherein the second link body is rotatably coupled to the second portion at a position different from the coupling portion, and wherein the elastic body is coupled to the coupling portion.

* * * * *